United States Patent
Ko et al.

(10) Patent No.: US 7,713,788 B2
(45) Date of Patent: May 11, 2010

(54) METHOD OF MANUFACTURING SEMICONDUCTOR PACKAGE USING REDISTRIBUTION SUBSTRATE

(75) Inventors: Jun-Young Ko, Chungcheongnam-do (KR); Dae-Sang Chan, Chungcheongnam-do (KR); Heui-Seog Kim, Chungcheongnam-do (KR); Wha-Su Sin, Chungcheongnam-do (KR); Jae-Yong Park, Chungcheongnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 90 days.

(21) Appl. No.: 12/197,067

(22) Filed: Aug. 22, 2008

(65) Prior Publication Data

US 2009/0053858 A1 Feb. 26, 2009

(30) Foreign Application Priority Data

Aug. 24, 2007 (KR) ...................... 10-2007-0085727

(51) Int. Cl.
 *H01L 21/44* (2006.01)
(52) U.S. Cl. ...................... 438/118; 438/106; 438/108; 438/109; 438/110; 438/114; 257/E21.499
(58) Field of Classification Search ........................ None
 See application file for complete search history.

(56) References Cited

U.S. PATENT DOCUMENTS

2002/0100600 A1 8/2002 Albert et al.
2003/0113979 A1* 6/2003 Bieck et al. ................. 438/411

FOREIGN PATENT DOCUMENTS

JP  2005-011856  1/2005
KR  2005-0021078  3/2005

OTHER PUBLICATIONS

English language abstract of Japanese Publication No. 2005-011856.
English language abstract of Korean Publication No. 2005-0021078.

* cited by examiner

*Primary Examiner*—N Drew Richards
*Assistant Examiner*—Kyoung Lee
(74) *Attorney, Agent, or Firm*—Muir Patent Consulting, PLLC (57) ABSTRACT

An inexpensive method of manufacturing a semiconductor package using a redistribution substrate that is relatively thin. The method includes: attaching a semiconductor chip to a redistribution substrate; attaching the redistribution substrate to which the semiconductor chip is attached to a printed circuit board; removing a support substrate of the redistribution substrate; forming via holes to expose a bond pad of the semiconductor chip and a bond finger of the printed circuit board; and filling the via holes with a conductive material. Meanwhile, a redistribution substrate to which at least one other semiconductor chip may be mounted on the redistribution substrate.

24 Claims, 8 Drawing Sheets

METHOD OF MANUFACTURING SEMICONDUCTOR PACKAGE USING REDISTRIBUTION SUBSTRATE

CROSS-REFERENCE TO RELATED PATENT APPLICATIONS

This application claims the benefit of Korean Patent Application No. 10-2007-0085727, filed on Aug. 24, 2007, in the Korean Intellectual Property Office, the disclosure of which is incorporated herein by reference.

BACKGROUND

The present invention relates to a method of manufacturing a semiconductor package, and more particularly, to an inexpensive method of manufacturing a semiconductor package and a stacked semiconductor package to be relatively thin, respectively, using a redistribution substrate.

SUMMARY

The present invention provides an inexpensive method of manufacturing a relatively thin semiconductor package using a redistribution substrate. Additionally, the method may protect the thin semiconductor chips in the semiconductor package from impacts during handling.

An embodiment of the present invention provides a method of manufacturing a semiconductor package using a redistribution substrate including: attaching a semiconductor chip to a redistribution substrate; attaching the redistribution substrate to which the semiconductor chip is attached to a printed circuit board; removing a support substrate of the redistribution substrate; forming via holes exposing a bond pad of the semiconductor chip and a bond finger of the printed circuit board; and filling the via holes with a conductive material.

The redistribution substrate may include: a support substrate disposed in an upper portion of the redistribution substrate; a mask layer which is disposed under the support substrate, has an opening exposing the bond pad of the semiconductor chip and the bond finger of the printed circuit board, and is formed of an insulating material; and a metal distribution layer which is disposed under the mask layer and connects the bond pad of the semiconductor chip to the bond finger of the printed circuit board.

Alternatively, the redistribution substrate can include: a support substrate disposed in an upper portion of the redistribution substrate; and a metal distribution layer which is disposed under the support substrate and connects the bond pad of the semiconductor chip to the bond finger of the printed circuit board.

Before the redistribution substrate is attached to the printed circuit board, the method may further include polishing a lower surface of semiconductor chip attached to the redistribution substrate. The lower surface of the semiconductor chip may be polished to a thickness of 50 μm or less.

The conductive material filling the via hole may be conductive ink. After filing the via hole with a conductive material, the method may further include attaching a solderball to a lower surface of the printed circuit board.

According to another aspect of the present invention, there is provided a method of manufacturing a semiconductor package using a redistribution substrate, the method including: attaching a first semiconductor chip to a first redistribution substrate; attaching the first redistribution substrate to which the first semiconductor chip is attached to a first printed circuit board; removing a support substrate of the first redistribution substrate; forming first via holes exposing a bond pad of the first semiconductor chip and a bond finger of the first printed circuit board; filling the first via holes with a conductive material; preparing a second redistribution substrate to which a second semiconductor chip is attached; attaching the second redistribution substrate to the first redistribution substrate from which the support substrate is removed, in a way that the second semiconductor chip is located under the first redistribution substrate; removing a support substrate of the second redistribution substrate; forming second via holes exposing the conductive material filling the first via hole and the bond pad of the second semiconductor chip; and filling the second via hole with a conductive material.

The first and second semiconductor package may be polished to a thickness of 50 μm or less. The conductive material filling the second and third via holes may be conductive ink.

A third redistribution substrate may be additionally attached to the second redistribution substrate.

Each of the first, second, and third redistribution substrate may include: a support substrate disposed in an upper portion of each redistribution substrate; a mask layer which is disposed under the support substrate, has an opening exposing the bond pad of the semiconductor chip and the bond finger of the printed circuit board, and is formed of an insulating material; and a metal distribution layer which is disposed under the mask layer and connects the bond pad of the semiconductor chip to the bond finger of the printed circuit board. Alternatively, each of the first, second, and third redistribution substrate can include: a support substrate disposed in an upper portion of each redistribution substrate; and a metal distribution layer which is disposed under the support substrate and connects the bond pad of the semiconductor chip to the bond finger of the printed circuit board.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIGS. 1-10 are cross-sectional views illustrating a method of manufacturing a semiconductor package using a redistribution substrate 110, according to an embodiment of the present invention.

Figure 1:
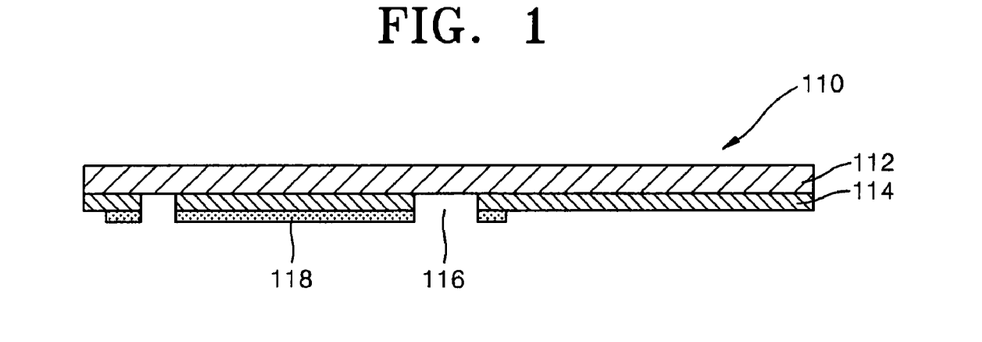
FIGS. 1-10 are cross-sectional views illustrating a method of manufacturing a semiconductor package using a redistribution substrate, according to an embodiment of the present invention.

Specifically, FIG. 1 is a cross-sectional view of the redistribution substrate 110 according to one embodiment of the present invention. Referring to FIG. 1, the redistribution substrate 110 includes a support substrate 112, a mask layer 114 which is attached to a lower surface of the support substrate 112 by an adhesive element; and a metal distribution layer 118 formed on a lower surface of the mask layer 114.

The support substrate 112 may be formed of a polyethylene-terephthalate (PET) film, or the like. Alternatively, the support substrate 112 may be formed of a hard-type material. The mask layer 114 may be formed of an insulating material, and may have an opening 116 to expose a bond pad (104 of FIG. 3) of a semiconductor chip. The semiconductor chip may be attached to a lower surface of the redistribution substrate 110 in a subsequent process step, followed by a bond finger (132 of FIG. 5) of a printed circuit board. The support substrate 112 and the mask layer 114 may be attached to each other by an adhesive or an adhesive element whose adhesive force is decreased when exposed to light.

The metal distribution layer 118 may be formed under the mask layer 114. In this regard, the metal distribution layer 118 may be a copper distribution layer which may horizontally connect the bond pad of a semiconductor chip and the bond finger of a printed circuit board. The metal distribution layer 118 may be formed on the lower surface of the mask layer 114 using an electroplating method or a lamination method.

Figure 2:
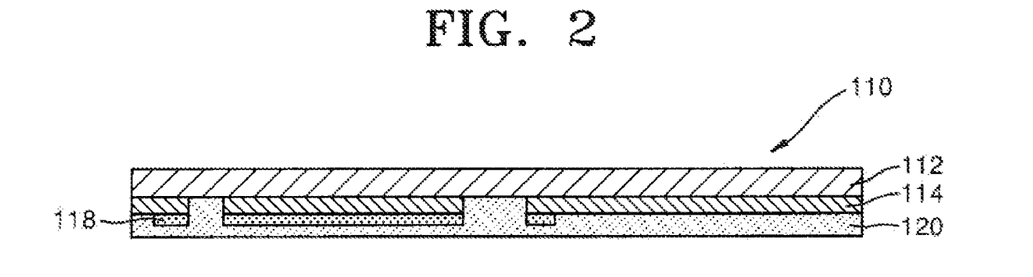
Figure 3:
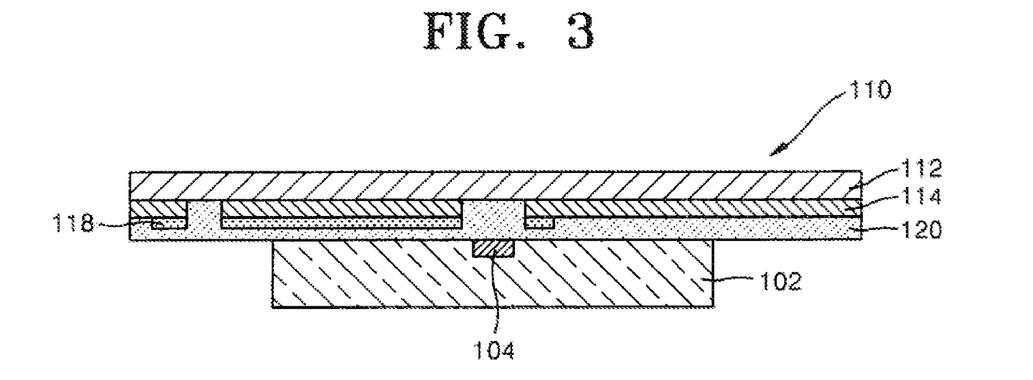

Referring to FIGS. 2 and 3, a first adhesive 120 is coated on the lower portion of the redistribution substrate 110 and then a pre-curing process is performed. The first adhesive 120 may be a transparent or semi-transparent adhesive. According to an embodiment of the present invention, the first adhesive 120 may be a photo solder resist (PSR) adhesive and may react when exposed to light. For example, the inner structure of the PSR adhesive may change when exposed to light. The pre-curing temperature and time may vary according to the type of first adhesive 120. The pre-curing process may be performed until the first adhesive 120 does not flow and gels.

Then, a semiconductor chip 102 is attached to the first adhesive 120 such that an active surface of the semiconductor chip 102 in which a circuit is formed contacts the first adhesive 120. A bond pad 104 may be formed in an edge portion of the semiconductor chip 102. Alternatively, the bond pad 104 may be formed in a central portion of the semiconductor chip 102 like conventional memory semiconductor devices. Then, a curing process is performed on the redistribution substrate 110 to which the semiconductor chip 102 is attached so that the first adhesive 120 is completely hardened and the semiconductor chip 102 is completely attached to the redistribution substrate 110.

Figure 4:
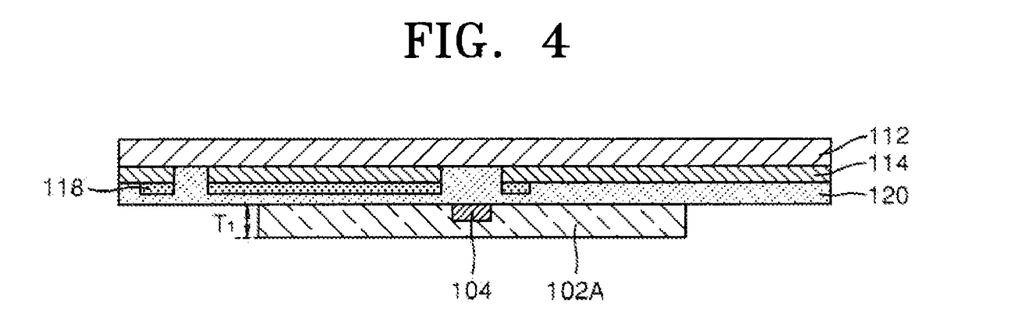

Referring to FIG. 4, a lower portion of the semiconductor chip 102 attached to the lower portion of the redistribution substrate 110 is polished. In general, it is difficult to polish a lower portion of a semiconductor chip to a predetermined thickness for many reasons. For example, in the polishing process, a semiconductor chip may be warped and damaged. However, according to an embodiment of the present invention, the semiconductor chip 102 is attached to the redistribution substrate 110, and then the lower portion of the semiconductor chip 102 is polished. As such, the semiconductor chip 102 is not damaged or cracked during treatment and transportation. Referring to FIG. 4 again, according to an embodiment of the present invention, the semiconductor chip 102 may be polished to form a semiconductor chip 102A having a thickness T1 of about 50 μm or less.

Therefore, according to an embodiment of the present invention, the thickness of a semiconductor chip 102A in a semiconductor package (100 of FIG. 9) may be reduced. Thus, the thickness of the semiconductor package including the semiconductor chip 102A may also be reduced. Furthermore, the thickness of a stack-type semiconductor package (500 of FIG. 16) may also be reduced.

Figure 5:
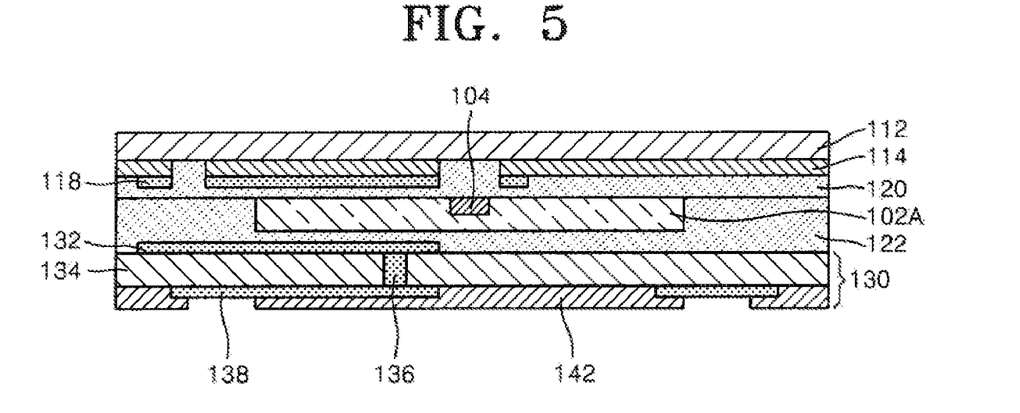

Referring to FIG. 5, the redistribution substrate 110 to which the polished semiconductor chip 102A is attached to a printed circuit board (PCB) 130. The printed circuit board 130 includes a metallic distribution including a bond finger 132 formed on an insulating substrate 134. The metallic distribution including the bond finger 132 is connected to a solderball pad 138 formed on a lower surface of the insulating substrate 134 through a via hole 136. A solder mask 142 formed of an insulating material is coated on a lower surface of the printed circuit board 130.

A method of attaching the redistribution substrate 110 to which the semiconductor chip 102A is attached to the printed circuit board 130 will now be described in detail. First, a second adhesive 122 which is pre-cured is applied to the printed circuit board 130 and the redistribution substrate 110 is combined with the printed circuit board 130. Then, a curing process is performed such that the redistribution substrate 110 is completely attached to the printed circuit board 130. In this regard, the second adhesive 122 may be the same as the first adhesive 120. Specifically, the first and second adhesives 120 and 122 may be an adhesive that may react when exposed to light. For example, when the first and second adhesives 120 and 122 are PSR, only one irradiation of ultra-violet (UV) light may be enough to form a via hole.

Figure 6:
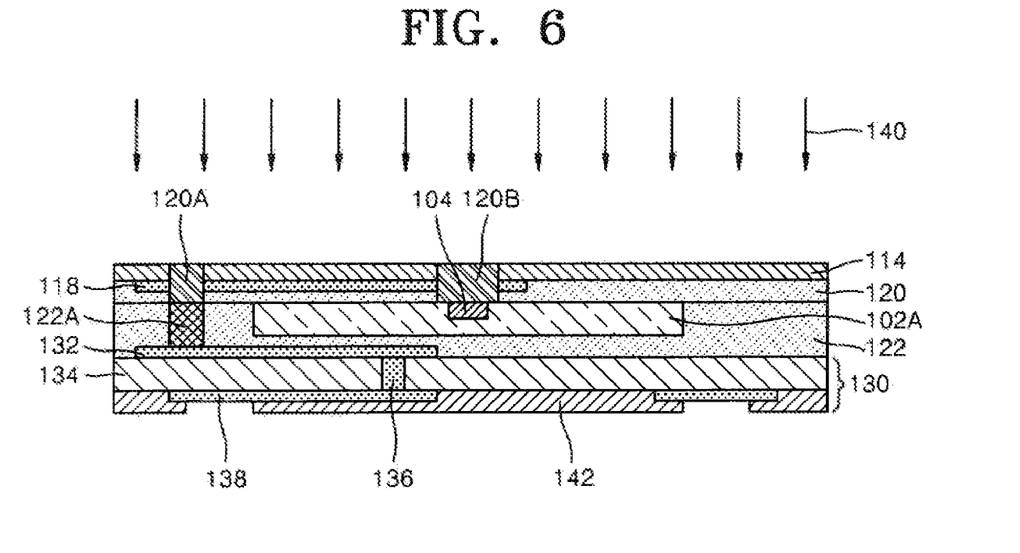
Figure 7:
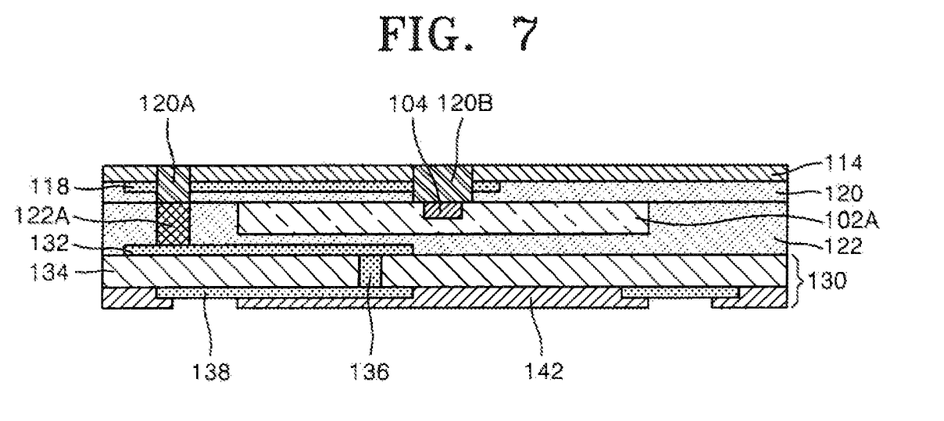
Figure 8:
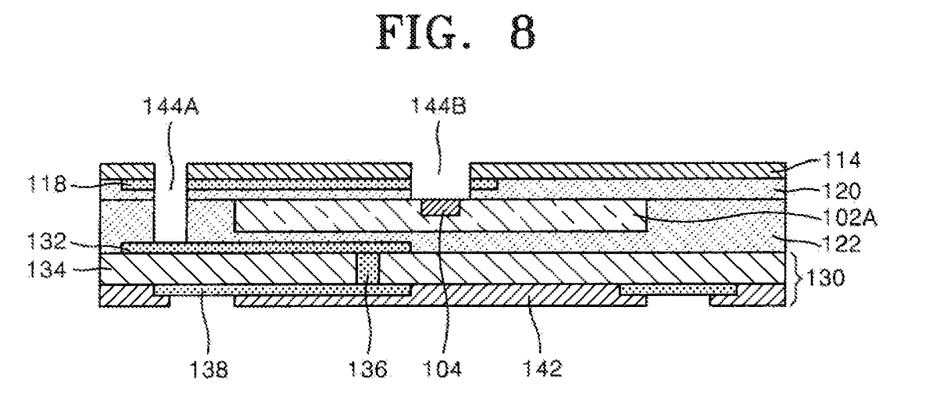

Referring to FIGS. 6-8, UV light 140 is irradiated to the obtained structure in which the redistribution substrate 110 is combined with the printed circuit board 130. In this regard, when the support substrate 112 of the redistribution substrate 110 is transparent, the adhesive force of the adhesive element (not shown) between the support substrate 112 and the mask layer 114 may be decreased when exposed to the UV light 140.

Concurrently, the UV light 140 may also be irradiated to the first and second adhesives 120 and 122 under the redistribution substrate 110 through the opening (116 of FIG. 1) of the redistribution substrate 110 so that portions 120A and 120B of the first adhesive 120 and a portion 122A of the second adhesive 122 may react with the UV light. Subsequently, referring to FIG. 7, the support substrate 112 may be removed from the redistribution substrate 110. Then, referring to FIGS. 7 and 8, the portions 120A and 120B of the first adhesive 120 and the portion 122A of the second adhesive 122, which may react to irradiation of UV light, are removed by dry etching or wet etching to form first via holes 144A and 144B. The first via holes 144A and 144B expose the bond finger 132 of the printed circuit board 130 and the bond pad 104 of the semiconductor chip 104, respectively.

Figure 9:
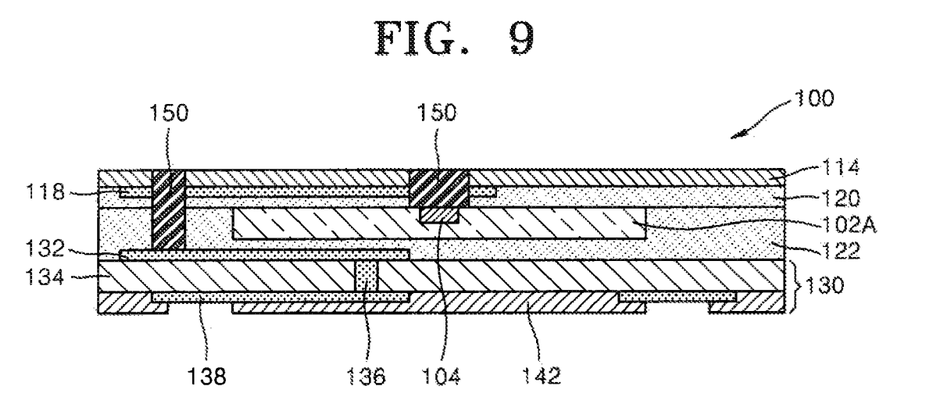
Figure 10:
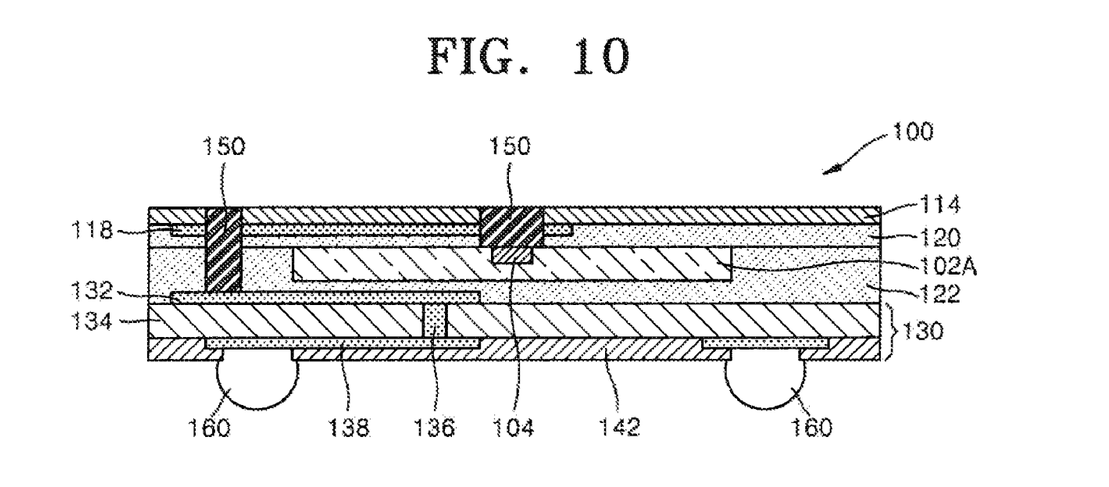

Referring to FIGS. 8-10, the first via holes 144A and 144B are filled with a conductive material 150, such as metal or conductive ink. Then, solderballs 160 may be attached to the solderball pad 138 in the lower portion of the printed circuit board 130, thereby completing the manufacture of a semiconductor package 100 using the redistribution substrate 110 according to the current embodiment of the present invention.

Figure 11:
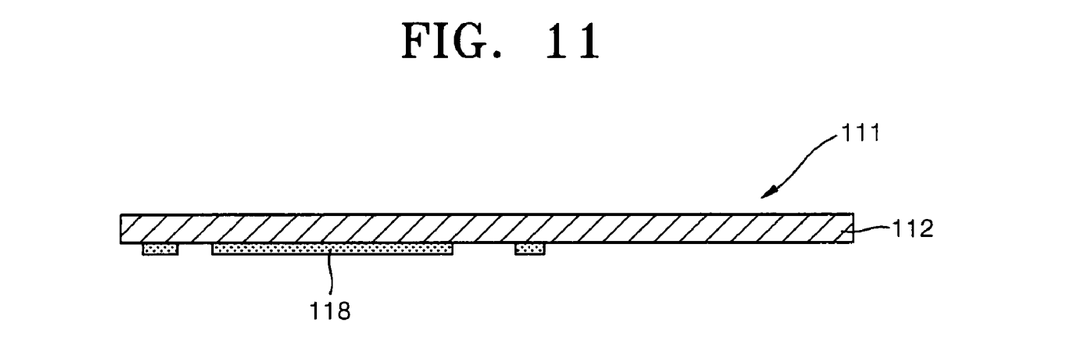
FIG. 11 is a cross-sectional view of a redistribution substrate, different from the redistribution substrate of FIG. 1, according to another embodiment of the present invention.

FIG. 11 is a cross-sectional view of a redistribution substrate 111 different from the redistribution substrate of FIG. 1, and according to a modified embodiment of the present invention.

Referring to FIG. 11, unlike the redistribution substrate 110 of the previous embodiment, which includes a the mask layer 114, the redistribution substrate 111 of the current embodiment includes a metal distribution layer 118 directly formed under a support substrate 112. The metal distribution layer 118 connects a bond pad of a semiconductor chip and a bond finger of a printed circuit board.

A material whose adhesive force is decreased when exposed to light or heat may be coated on a lower surface of the support substrate 112. The via hole etching process discussed in the previous embodiment may further include forming a separate photo mask, and the use of a laser drilling method instead of a wet etching or dry etching process.

FIGS. 12-16 are cross-sectional views illustrating a method of manufacturing a semiconductor package using a redistribution substrate, according to another embodiment of the present invention.

Figure 16:
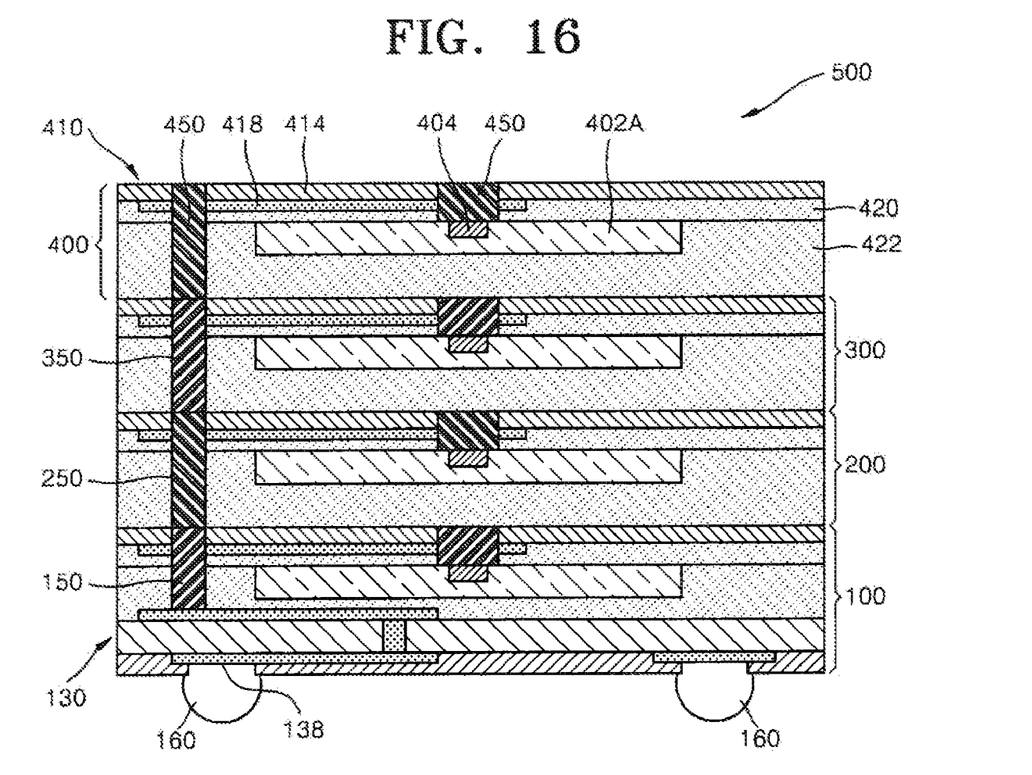

Referring to FIG. 16, second, third, and fourth semiconductor packages 200, 300, and 400 are stacked on the semiconductor package 100 of FIG. 9 to form a stacked semiconductor package 500.

Figure 12:
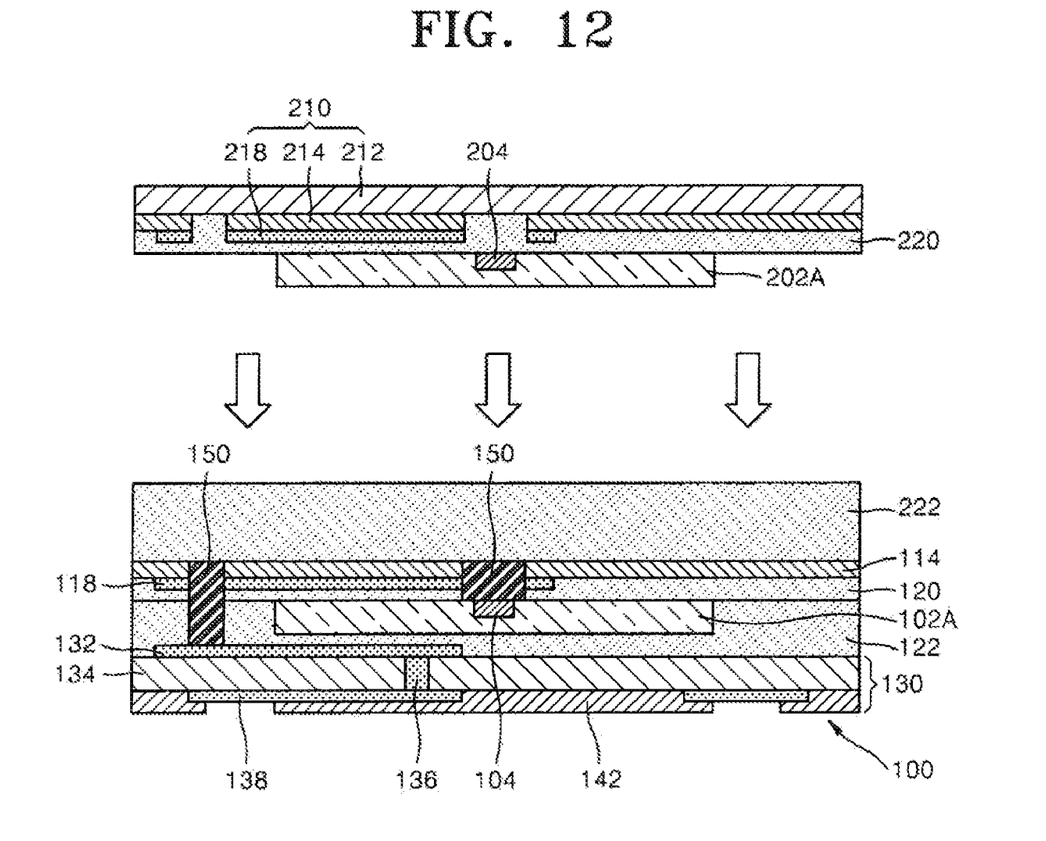
FIGS. 12-16 are cross-sectional views illustrating a method of manufacturing a semiconductor package using a redistribution substrate, according to another embodiment of the present invention.

Referring to FIG. 12, first, a second semiconductor chip 202A is attached to a second redistribution substrate 210 by a first adhesive 220. Like in the previous embodiment, the second redistribution substrate 210 may include a support substrate 212, a mask layer 214, and a metal distribution layer 218. A second adhesive 222 is coated on the semiconductor package 100 of FIG. 9 and treated to form a gel. The second redistribution substrate 210 is adhered to the semiconductor package 100, as illustrated in FIG. 12.

Figure 13:
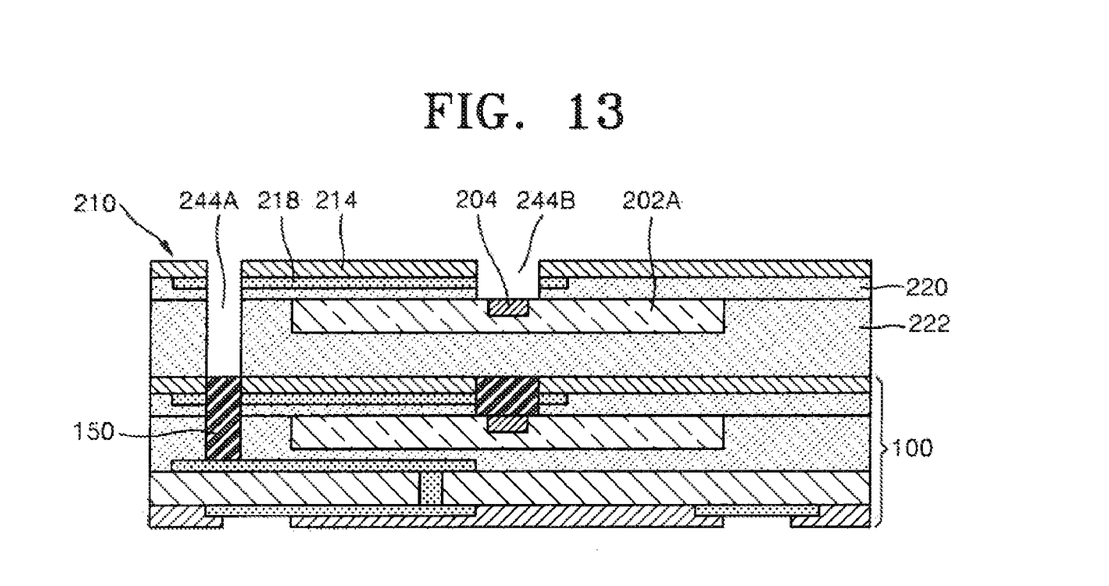
Figure 14:
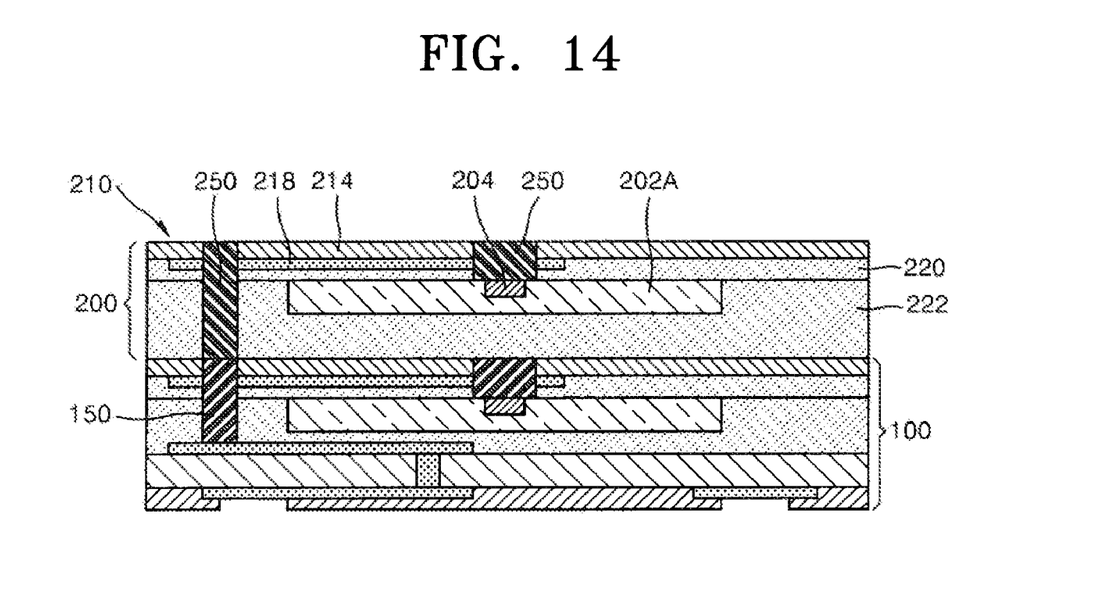
Figure 15:
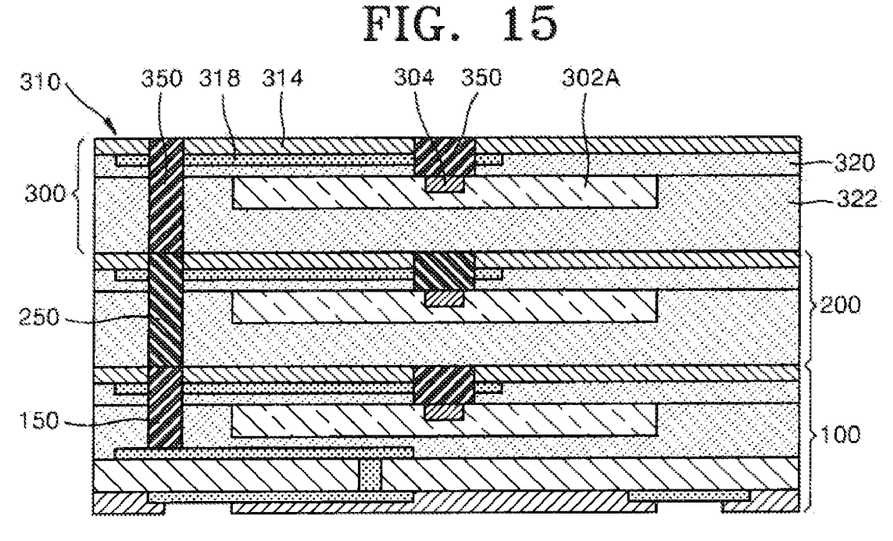

Then, UV light is irradiated to the second redistribution substrate 210 after the support substrate 212 is removed. Portions of the first and second adhesive 220 and 222, which react when exposed to irradiation of UV light, are removed by dry etching or wet etching to form second via holes 244A and 244B as illustrated in FIG. 13. The second via hole 244A may expose the conductive material 150 filling the first via hole 144A, and the second via hole 244B may expose a bond pad 204 of the second semiconductor chip 202A. In this regard, the bond pad 204 may be disposed in a central portion of the second semiconductor chip 202A and may be polished until the thickness of the second semiconductor chip 202A is about 50 µm or less. Finally, referring to FIG. 14, the second via holes 244A and 244B are filled with a conductive material 250, for example, conductive ink, thereby obtaining a stack structure including the semiconductor package 100 and the second semiconductor package 200.

In another embodiment, a third semiconductor package 300 may be stacked on the second semiconductor package 200 in the same manner as described above with reference to FIG. 15. FIG. 16 is a cross-sectional view of a stacked semiconductor package 500 manufactured in such a manner that the first, second, third, and fourth semiconductor packages 100, 200, 300, and 400 are stacked and then a solderball 160 is attached to the solderball pad 138 in the lower portion of the printed circuit board 130 of the semiconductor package 100.

Therefore, a bond pad may be connected to a printed circuit board through metal distribution layers 118, 218, 318, and 418 of prepared redistribution substrates 110, 210, 310, and 410. Each metal distribution layer may have a thickness of about 10 µm, and thus the stacked semiconductor package 500 may have a substantially small thickness. Also, the stacked semiconductor package 500 may be manufactured by removing support substrates 112, 212, 312, and 412 of the redistribution substrates 110, 210, 310, and 410 while a semiconductor package 500 is manufactured. The thickness of semiconductor chips 102, 202, 302, and 402 may be further reduced to about 50 µm or less if semiconductor chips 102, 202, 302, and 402 are polished while being attached to redistribution substrates 110, 210, 310, and 410. Therefore, the stacked semiconductor package 500 may have a small thickness.

Figure 17:
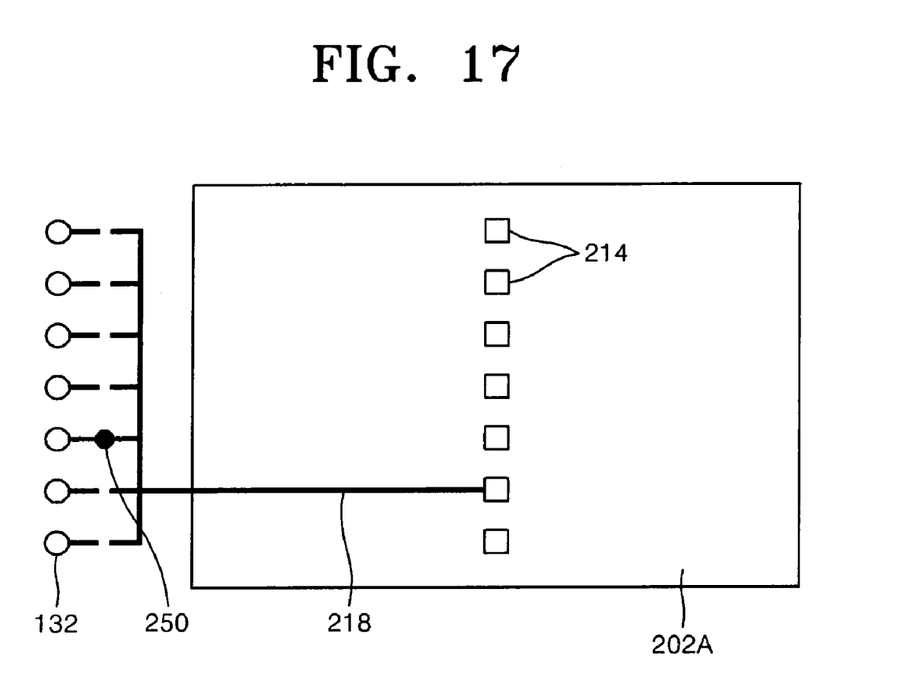
FIGS. 17 and 18 are plan views illustrating electrical connections by filling via holes of the semiconductor package of FIG. 16 with a conductive element, according to an embodiment of the present invention.
Figure 18:
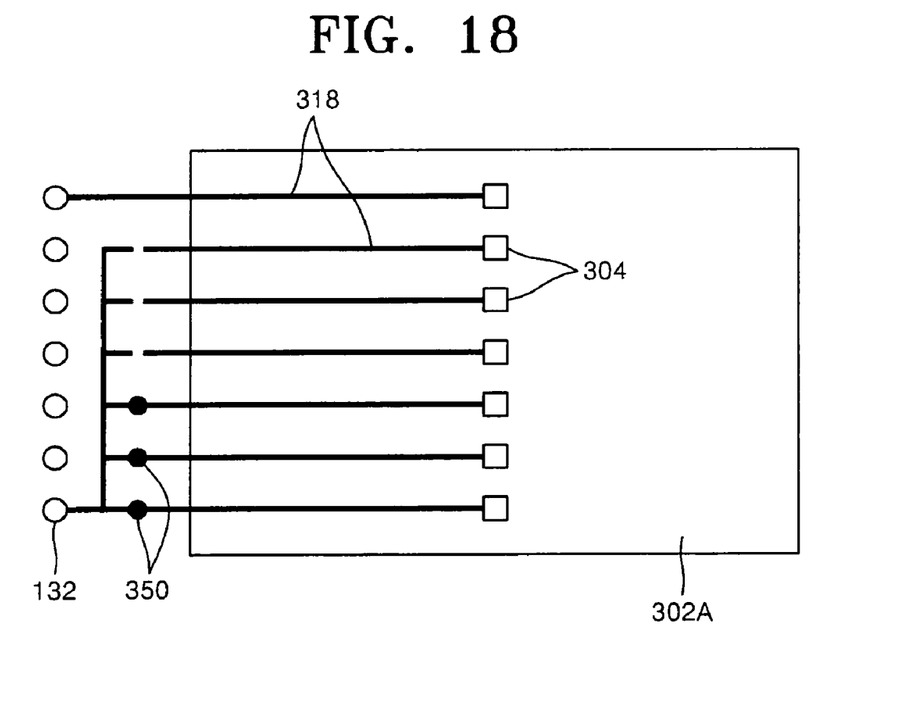

FIGS. 17 and 18 are plan views illustrating electrical connections by filling via holes of the semiconductor package of FIG. 16 with a conductive element, according to an embodiment of the present invention.

Referring to FIGS. 16-18, the stacked semiconductor package 500 is electrically connected such that bond pads of the semiconductor chips 102, 202, 302, and 402 are finally connected to the solderball 160 sequentially through metal distributions 118, 218, 318, and 418; conductive materials 150, 250, 350, and 450 filling via holes; and a bond finger 132 of a printed circuit board 130.

Meanwhile, referring to FIG. 17, among conductive materials 250 filling via holes, a plurality of conductive materials can be connected to a single bond pad 214 through a metal distribution layer 218. On the other hand, referring to FIG. 18, a plurality of bond pads 304 can be connected to a single bond finger 132 through a metal distribution layer 318. Therefore, within the stacked semiconductor package 500, electrical connections may be made by selectively filling via holes with conductive materials 250 and 350. Hence, when the same kind or different kinds of semiconductor chips are stacked, they can be effectively electrically connected by controlling such connection relationships.

As described above, a semiconductor package may be manufactured to be relatively thin and protected from any impact occurring when it is conveyed and handled. This is because the semiconductor package may be polished, handled, or conveyed while it is attached to a redistribution substrate.

Second, a semiconductor package may be manufactured at a lower cost because the bond pad of the semiconductor chip may be electrically connected through a prepared redistribution substrate.

Third, the thickness of a semiconductor package may be smaller when using a metal distribution layer than when a semiconductor chip is stacked using a wire. This is because redistribution of a bond pad may be made outside the semiconductor chip through a metal distribution layer having a thickness of about 10 µm formed on a lower portion of a redistribution substrate. Furthermore, the thickness of the semiconductor package may be further reduced since a support substrate of the redistribution substrate is removed after the manufacturing process is completed.

Fourth, there is no need to form a mask layer using a photolithography process because a via hole may be formed using a mask layer included in the redistribution substrate.

While this invention has been particularly shown and described with reference to embodiments thereof, it will be understood by those skilled in the art that various changes in form and details may be made therein without departing from the spirit and scope of the invention as defined by the appended claims.

What is claimed is:

1. A method of manufacturing a semiconductor package using a redistribution substrate, the method comprising:
attaching a semiconductor chip to a redistribution substrate;

attaching the redistribution substrate, which includes the semiconductor chip, to a printed circuit board;

removing a support substrate of the redistribution substrate;

forming via holes to expose a bond pad of the semiconductor chip and a bond finger of the printed circuit board; and filling the via holes with a conductive material.

2. The method of claim 1, wherein the redistribution substrate comprises:

a support substrate;

a mask layer disposed under the support substrate, wherein the mask layer has an opening to expose the bond pad of the semiconductor chip and the bond finger of the printed circuit board, wherein the mask layer is formed of an insulating material; and a metal distribution layer disposed under the mask layer, where the metal distribution layer connects the bond pad of the semiconductor chip to the bond finger of the printed circuit board.

3. The method of claim 2, wherein the support substrate comprises a transparent material.

4. The method of claim 2, wherein the support substrate is attached to the mask layer by an adhesive element, where the adhesive element is configured to have an adhesive force that decreases when exposed to light.

5. The method of claim 1, wherein the redistribution substrate comprises:

a support substrate; and a metal distribution layer disposed under the support substrate, where the metal distribution layer connects the bond pad of the semiconductor chip to the bond finger of the printed circuit board.

6. The method of claim 1, wherein attaching the semiconductor chip to the redistribution substrate comprises:

coating a first adhesive on the redistribution substrate; and attaching the semiconductor chip to the redistribution substrate via the first adhesive coating so that an active area of the semiconductor chip contacts the redistribution substrate.

7. The method of claim 6, wherein the first adhesive coated on the redistribution substrate reacts when exposed to light.

8. The method of claim 1, wherein the bond pad is formed in a central portion of the semiconductor chip.

9. The method of claim 1, wherein attaching the redistribution substrate, which includes the semiconductor chip, to the printed circuit board comprises:

coating a second adhesive on the printed circuit board; and attaching the redistribution substrate to the printed circuit board via the second adhesive coating so that a lower surface of the semiconductor chip contacts the printed circuit board.

10. The method of claim 9, wherein the second adhesive is substantially the same material as the first adhesive.

11. The method of claim 1, wherein a lower surface of the semiconductor chip attached to the redistribution substrate is polished before the redistribution substrate is attached to the printed circuit board.

12. The method of claim 11, wherein the lower surface of the semiconductor chip is polished to a thickness of 50 μm or less.

13. The method of claim 4, wherein removing the support substrate from the redistribution substrate comprises:

irradiating ultra-violet (UV) light to the support substrate to decrease the adhesive force of the adhesive element; and removing the support substrate from the mask layer.

14. The method of claim 13, wherein the UV light changes an inner structure of the first and second adhesives.

15. The method of claim 1, wherein the conductive material filling the via hole is conductive ink.

16. The method of claim 1, wherein a solderball is attached to a lower surface of the printed circuit board after the via hole is filled with a conductive material.

17. A method of manufacturing a semiconductor package using a redistribution substrate, the method comprising:

attaching a first semiconductor chip to a first redistribution substrate;

attaching the first redistribution substrate, which includes the first semiconductor chip, to a first printed circuit board;

removing a support substrate of the first redistribution substrate;

forming first via holes to expose a bond pad of the first semiconductor chip and a bond finger of the first printed circuit board;

filling the first via holes with a conductive material;

preparing a second redistribution substrate, which includes a second semiconductor chip;

attaching the second redistribution substrate to the first redistribution substrate where the support substrate was removed so that the second semiconductor chip is located under the first redistribution substrate;

removing a support substrate of the second redistribution substrate;

forming second via holes to expose the conductive material in the first via holes and a bond pad of the second semiconductor chip; and filling the second via holes with a conductive material.

18. The method of claim 17, wherein each of the first and second semiconductor packages are polished to a thickness of 50 μm or less.

19. The method of claim 17, wherein the second redistribution substrate is attached to the first redistribution substrate where the support substrate was removed by a second adhesive that reacts when exposed to light.

20. The method of claim 17, wherein after the second via holes are filled with conductive material, the method of manufacturing the semiconductor package further comprises:

preparing a third redistribution substrate which includes a third semiconductor chip;

attaching the third redistribution substrate to the second redistribution substrate where the support substrate was removed, so that the third semiconductor chip is located under the second redistribution substrate;

removing a support substrate from the third redistribution substrate;

forming third via holes to expose the conductive material in the second via holes and a bond pad of the third semiconductor chip; and filling the third via holes with a conductive material.

21. The method of claim 17, wherein a solderball is attached to a lower portion of the printed circuit board after filling the first via holes with the conductive material.

22. The method of claim 20, wherein each of the first, second, and third redistribution substrates further comprises:

a support substrate;

a mask layer disposed under the support substrate, wherein the mask layer has an opening to expose the bond pad of the corresponding semiconductor chip and the bond finger of the corresponding printed circuit board, wherein the mask layer is an insulating material; and a metal distribution layer disposed under the mask layer, where the metal distribution layer connects the bond pad of the corresponding semiconductor chip to the bond finger of the corresponding printed circuit board.

23. The method of claim 1, wherein each of the first, second, and third redistribution substrates comprises:
a support substrate; and
a metal distribution layer disposed under the support substrate, where the metal distribution layer connects the bond pad of the corresponding semiconductor chip to the bond finger of the corresponding printed circuit board.

24. The method of claim 1, wherein the conductive material filling the second and third via holes is conductive ink.

* * * * *